United States Patent
Chen et al.

(10) Patent No.: US 12,117,489 B2
(45) Date of Patent: Oct. 15, 2024

(54) DEVICE AND METHOD FOR MEASURING CHARACTERISTICS OF A WAFER

(71) Applicant: TAIWAN SEMICONDUCTOR MANUFACTURING COMPANY LTD., Hsinchu (TW)

(72) Inventors: Yung-Shun Chen, Hsinchu (TW); Chih-Chiang Chang, Taipei (TW); Chung-Peng Hsieh, New Taipei (TW); Yung-Chow Peng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 235 days.

(21) Appl. No.: 17/019,239

(22) Filed: Sep. 12, 2020

(65) Prior Publication Data
US 2022/0082621 A1 Mar. 17, 2022

(51) Int. Cl.
*G01R 31/317* (2006.01)
*G01R 27/26* (2006.01)
*G01R 31/10* (2006.01)
*H03B 27/00* (2006.01)
*H03L 7/00* (2006.01)

(52) U.S. Cl.
CPC ... *G01R 31/31727* (2013.01); *G01R 27/2605* (2013.01); *G01R 27/2617* (2013.01); *G01R 31/10* (2013.01); *H03B 27/00* (2013.01); *H03L 7/00* (2013.01)

(58) Field of Classification Search
CPC .......... G01R 31/31727; G01R 27/2605; G01R 27/2617; G01R 31/10; H03B 27/00; H03L 7/00
See application file for complete search history.

(56) References Cited

U.S. PATENT DOCUMENTS

| | | | |
|---|---|---|---|
| 7,659,126 B1 * | 2/2010 | Smith | G01R 31/318511 324/762.05 |
| 9,143,116 B2 | 9/2015 | Hsieh et al. | |
| 2005/0149777 A1 * | 7/2005 | Yuan | G01R 31/2882 714/700 |
| 2009/0302828 A1 * | 12/2009 | Chang | H03B 27/00 324/76.13 |
| 2012/0286836 A1 * | 11/2012 | Hsieh | G01R 31/2824 327/164 |
| 2015/0130543 A1 * | 5/2015 | Jou | H03B 1/00 331/16 |
| 2015/0380326 A1 * | 12/2015 | Chen | G01R 31/2858 257/48 |
| 2018/0224498 A1 * | 8/2018 | Jung | G01R 31/2894 |

FOREIGN PATENT DOCUMENTS

| | | | | |
|---|---|---|---|---|
| EP | 2028686 | * | 2/2009 | H01L 21/768 |
| JP | 2003028726 | * | 1/2003 | G01K 7/00 |

* cited by examiner

*Primary Examiner* — Alexander Satanovsky
*Assistant Examiner* — Sharah Zaab
(74) *Attorney, Agent, or Firm* — WPAT LAW; Anthony King

(57) ABSTRACT

A device for measuring characteristics of a wafer is provided. The device includes a first circuit on the wafer and having a first number of parallelly connected oscillators, and a second circuit on the wafer and having the first number of parallelly connected oscillators; wherein a first portion of the second circuit is disconnected from a second portion of the second circuit.

20 Claims, 9 Drawing Sheets

DEVICE AND METHOD FOR MEASURING CHARACTERISTICS OF A WAFER

BACKGROUND

In the semiconductor industry, ring oscillator (RO) circuits are used in monitoring a device's parameter (DC or AC) changes in response to frequency or power variations. RO circuits are also useful to monitor model-to-model (M2M) changes in simulation programs with integrated circuit emphasis (SPICE), or to monitor silicon-to-SPICE (S2S) gaps. DC parameters of an RO circuit, such as the effective drain current (Ieff), can be directly measured via a process control monitoring (PCM) device on the wafer. In contrast, AC parameters of an RO circuit, such as the effective capacitance (Ceff), needs to be obtained through calculation of other measured parameters For example, Ceff can be calculated from the equation Ieff=Ceff*VDD*freq. However, the Ceff tends to be influenced by both the short-current within the RO circuit and the front-end-of-line (FEOL)/back-end-of-line (BEOL) parasitic capacitance of the wafer.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1A:
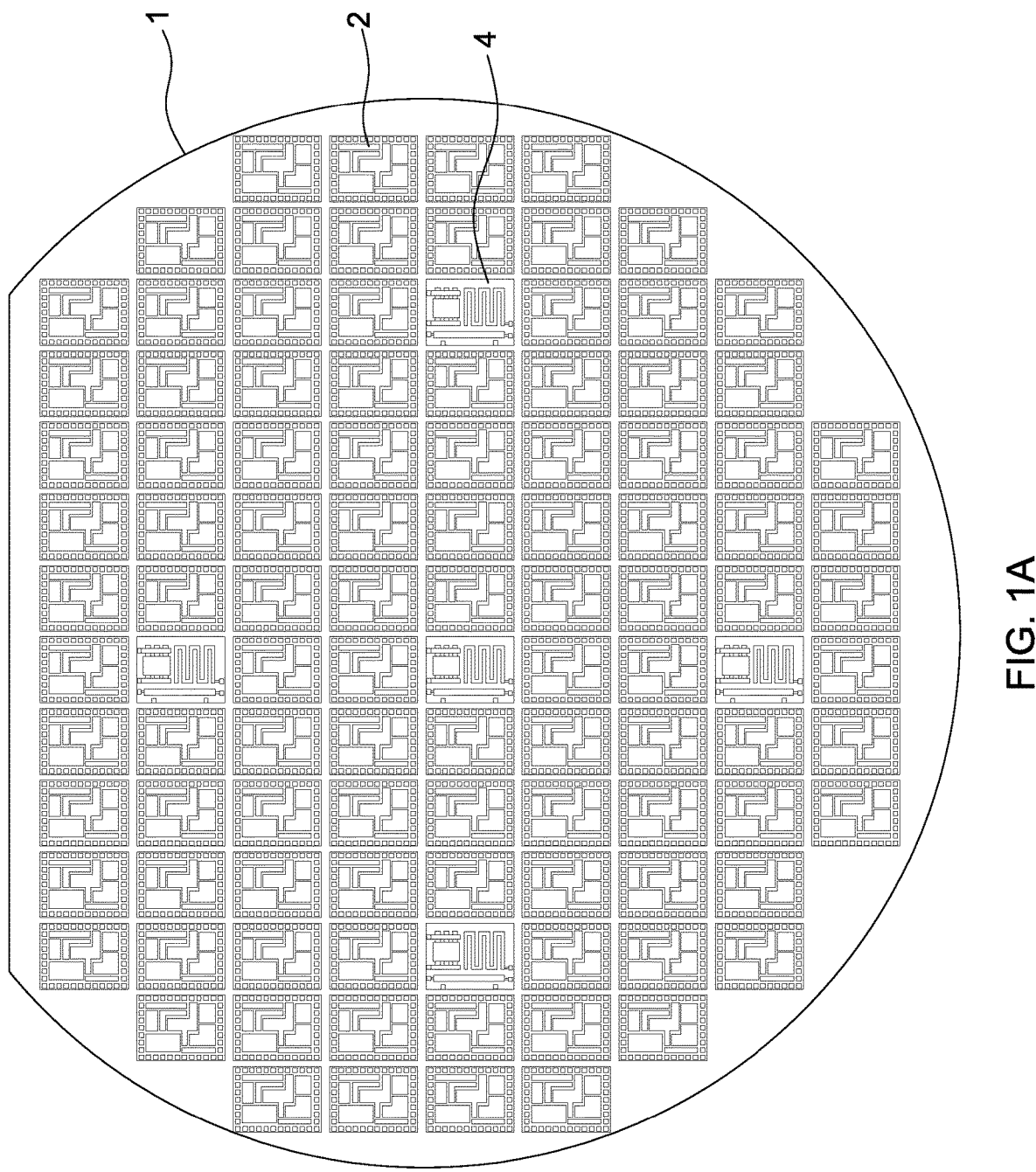
FIG. 1A illustrates a schematic view of a top view of a semiconductor wafer, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A methodology for eliminating the effects brought by short-current in the measurement of the effective capacitance is proposed. A methodology for eliminating the effects brought by FEOL/BEOL parasitic capacitance in the measurement of the effective capacitance is proposed.

FIG. 1A illustrates a schematic view of a top view of a semiconductor wafer, in accordance with some embodiments of the present disclosure.

FIG. 1A shows a semiconductor wafer 1 including a plurality of semiconductor dies. The semiconductor 1 can also be simply referred to as a wafer. The semiconductor dies of the semiconductor wafer 1 include a plurality of semiconductor devices 2 and several PCM devices 4. The semiconductor devices 2 are products that will be shipped to the customer after the manufacturing process of the semiconductor wafer 1 is finished.

The PCM devices 4 can be used to monitor the characteristics of the semiconductor wafer 1. The PCM devices 4 can be used to monitor the characteristics of the semiconductor wafer 1 during a wafer acceptance test (WAT). The PCM devices 4 may include various basic circuit elements that can be used in the construction of the semiconductor devices 2. The PCM devices 4 may include various types of test circuits. In some embodiments, the PCM devices 4 may include transistors of different types. In some embodiments, the PCM devices 4 may include transistors of different aspect ratios. In some embodiments, the PCM devices 4 may include passive devices such as resistors, capacitors, and inductors. In some embodiments, the PCM devices 4 may include conductive paths between transistors, resistors, capacitors or inductors.

Figure 1B:
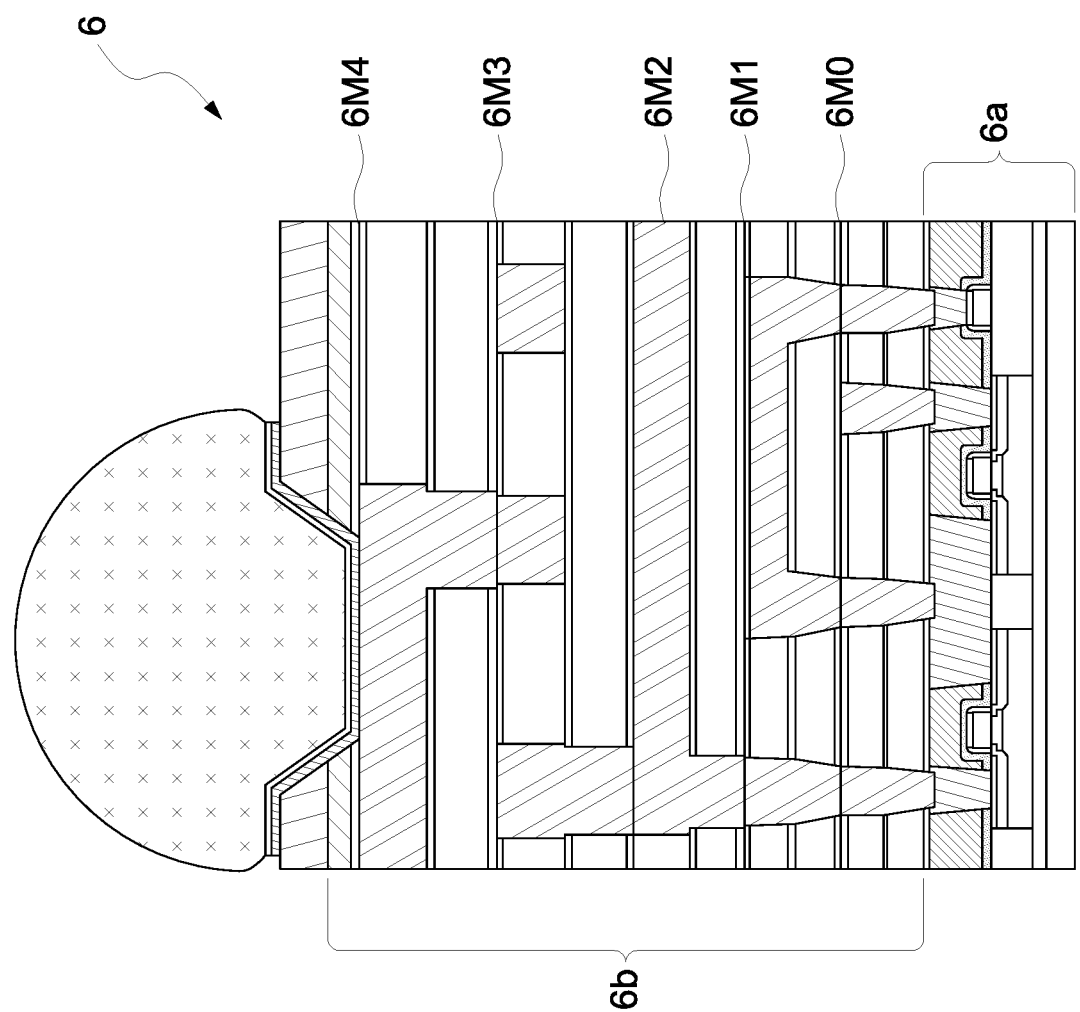
FIG. 1B illustrates a schematic view of a cross-sectional view of a portion of a semiconductor wafer, in accordance with some embodiments of the present disclosure.

FIG. 1B illustrates a schematic view of a cross-sectional view of a portion of a semiconductor wafer, in accordance with some embodiments of the present disclosure.

FIG. 1B shows a cross-sectional view of a device 6. The device 6 may correspond to either the semiconductor device 2 or the PCM device 4 as shown in FIG. 1A. The device 6 includes a front-end-of-line (FEOL) portion 6a and a back-end-of-line (BEOL) portion 6b.

FEOL is the first portion of IC fabrication where the individual devices (such as transistors, capacitors, resistors, etc.) are patterned in the semiconductor wafer. After the last step of FEOL, there is a wafer with isolated transistors and without any wires. FEOL generally covers everything up to (but not including) the deposition of metal interconnect layers.

BEOL is the second portion of IC fabrication where the individual devices (such as transistors, capacitors, resistors, etc.) get interconnected with wirings (i.e., the metal layers) on the wafer. BEOL generally begins when the first layer of metal is deposited on the wafer. BEOL includes contacts, insulating layers (dielectrics), metal levels, and bonding sites for chip-to-package connections.

Referring to FIG. 1B, the FEOL portion 6a may include several transistors, capacitors or resistors. The BEOL portion 6b may include metal layers 6M0, 6M1, 6M2, 6M3 and 6M4. In some embodiments, the BEOL portion 6b may include more metal layers. In some embodiments, the BEOL portion 6b may include fewer metal layers. The metal layers 6M0 and 6M1 can be electrically connected to each other through conductive vias. The metal layers 6M1 and 6M2 can be electrically connected to each other through conductive vias. The metal layers 6M2 and 6M3 can be electrically connected to each other through conductive vias. The metal layers 6M3 and 6M4 can be electrically connected to each other through conductive vias.

Figure 2:
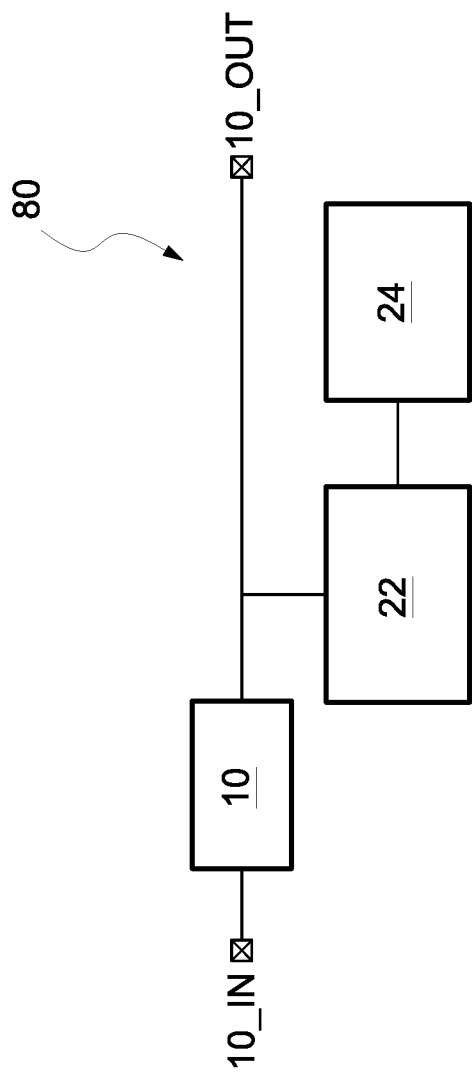
FIG. 2 illustrates a schematic view of a test circuit for a semiconductor wafer, in accordance with some embodiments of the present disclosure.

FIG. 2 illustrates a schematic view of a test circuit for a semiconductor wafer, in accordance with some embodiments of the present disclosure.

FIG. 2 shows a test circuit 80. The test circuit 80 can be located within the PCM device 4 as shown in FIG. 1A. The test circuit 80 can be a portion of the PCM device 4 as shown in FIG. 1A.

The test circuit 80 includes an oscillator 10, a clock generator 22, and a capacitance test circuit 24. The oscillator 10 can be a voltage-controlled oscillator (VCO) or a current-controlled oscillator (CCO). The oscillator 10 can be a ring oscillator (RO). The oscillator 10 includes an input terminal 10_IN and an output terminal 10_OUT. The clock generator 22 can be electrically coupled with the oscillator 10. The clock generator 22 may receive signals/commands provided by the oscillator 10. The capacitance test circuit 24 can be electrically coupled with the clock generator 22. The capacitance test circuit 24 may receive signals/commands provided by the clock generator 22. The details of the oscillator 10, the clock generator 22 and the capacitance test circuit 24 will be further illustrated in accordance with FIGS. 3A, 3B, 4 and 5.

Figure 3A:
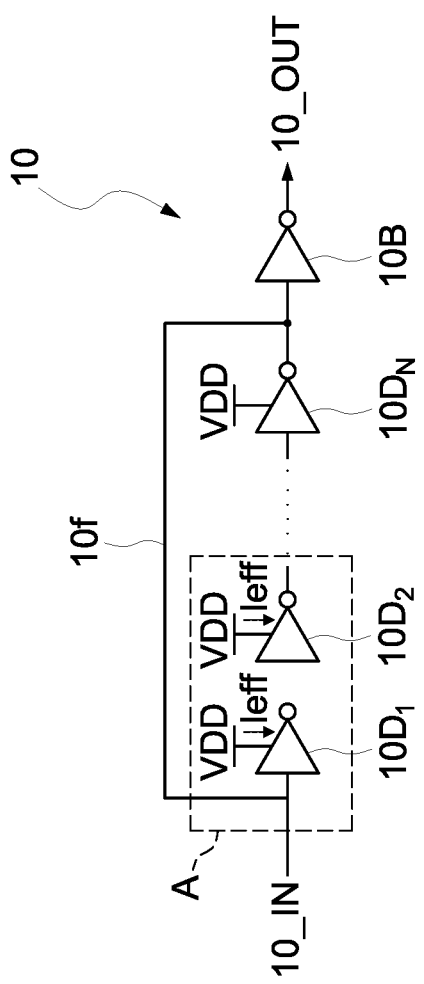
FIG. 3A illustrates a schematic view of an oscillator, in accordance with some embodiments of the present disclosure.

FIG. 3A illustrates a schematic view of an oscillator, in accordance with some embodiments of the present disclosure. FIG. 3A shows an oscillator 10, in accordance with some embodiments of the present disclosure.

The oscillator 10 includes an input terminal 10_IN, an output terminal 10_OUT, and several delay units connected in series. The oscillator 10 may include delay units $10D_1$, $10D_2$, ... $10D_N$. The delay units $10D_1$, $10D_2$, ... $10D_N$ can also be referred to as delay circuits, delay cells, delay blocks or delay devices in subsequent paragraphs of the present disclosure. The delay units $10D_1$, $10D_2$, ... $10D_N$ can be connected in series. The number N is a positive integer. In some embodiments, the number N can be an odd positive integer. The delay unit $10D_1$ can be connected to the delay unit $10D_N$ by a feedback loop $10f$. The input terminal of the delay unit $10D_1$ can be connected to the output terminal of the delay unit $10D_N$ by a feedback loop $10f$.

The output terminal of the delay unit $10D_N$ can be connected to a buffering unit 10B. The buffering unit 10B can also be referred to as a buffer, a buffering circuit, a buffering block or a buffering device in subsequent paragraphs of the present disclosure. The buffering unit 10B may adjust the amplitudes of the signals provided by the delay unit $10D_N$ before the oscillator 10 provides those signals to the circuits of the next stage. The buffering unit 10B may adjust the amplitude of the current/voltage provided by the delay unit $10D_N$.

The oscillator 10 can be a VCO or a CCO. The frequency of the signals provided by the output terminal 10_OUT can be calculated in accordance with the equation below:

$$\text{freq} = 1/(2*N*Td) \qquad \text{(equation 1)}$$

In equation 1, N is the number of the delay units and Td is the delay time of each of the delay units $10D_1$, $10D_2$, ... $10D_N$.

The effective capacitance $C_{eff}$ of the oscillator 10 can be used to evaluate the frequency response of the oscillator 10. The effective capacitance $C_{eff}$ can be obtained based on the effective current $I_{eff}$ of the oscillator 10, the supply voltage VDD, and the frequency of the signals provided by the oscillator 10. The effective capacitance $C_{eff}$ can be obtained according to the equation below:

$$C_{eff} = \frac{I_{eff}}{VDD \times freq} \quad \text{(equation 2)}$$

The effective current $I_{eff}$ is a current drawn from the supply voltage VDD per stage of the oscillator 10. The effective current eff can be understood as the current to charge or discharge the effective capacitance $C_{eff}$ of the oscillator 10. An inaccurate effective capacitance $C_{eff}$ may be obtained if the effective current $I_{eff}$ cannot be accurately measured. The details of the dotted rectangle A shown in FIG. 3A will be further illustrated in accordance with FIG. 3B.

Figure 3B:
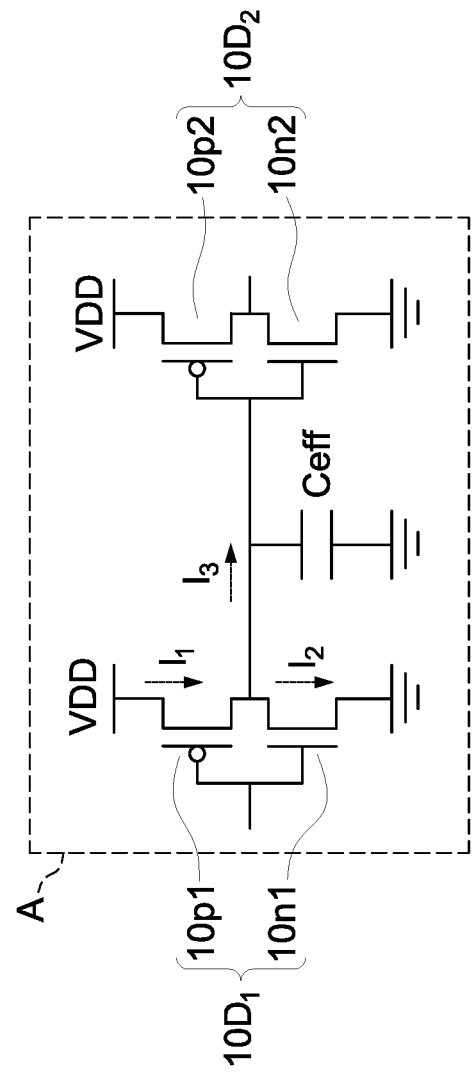
FIG. 3B illustrates a schematic view of a portion of an oscillator, in accordance with some embodiments of the present disclosure.

FIG. 3B illustrates a schematic view of a portion of an oscillator, in accordance with some embodiments of the present disclosure. FIG. 3B shows the details of the dotted rectangle A of FIG. 3A.

FIG. 3B shows the delay units $10D_1$ and $10D_2$ of the oscillator 10. The delay unit $10D_1$ can be implemented by transistors $10p1$ and $10n1$. The delay unit $10D_2$ can be implemented by transistors $10p2$ and $10n2$. In some embodiments, each of the transistors $10p1$ and $10p2$ can be a p-type Metal-Oxide-Semiconductor Field-Effect Transistor (MOSFET). In some embodiments, each of the transistors $10n1$ and $10n2$ can be an n-type MOSFET.

The effective capacitance $C_{eff}$ of the delay units $10D_1$ and $10D_2$ are shown in FIG. 3B as connected between the delay units $10D_1$ and $10D_2$. The current $I_1$ is the current drawn from the supply voltage VDD for charging the effective capacitance $C_{eff}$. The current $I_2$ is a short current that leaks to the ground during the operations of the oscillator 10. The current $I_3$ is the current that actually charges the effective capacitance $C_{eff}$. The current $I_1$ is the sum of the current $I_2$ and the current $I_3$. Since it is sometimes difficult for the short current $I_2$ to be measured, the current $I_1$ is usually deemed to be the effective current $I_{eff}$ that charges the effective capacitance $C_{eff}$. As a result, the short current $I_2$ leads to inaccurate evaluation of the effective capacitance $C_{eff}$, and thus accurate frequency response of the oscillator 10 cannot be obtained.

Figure 4:
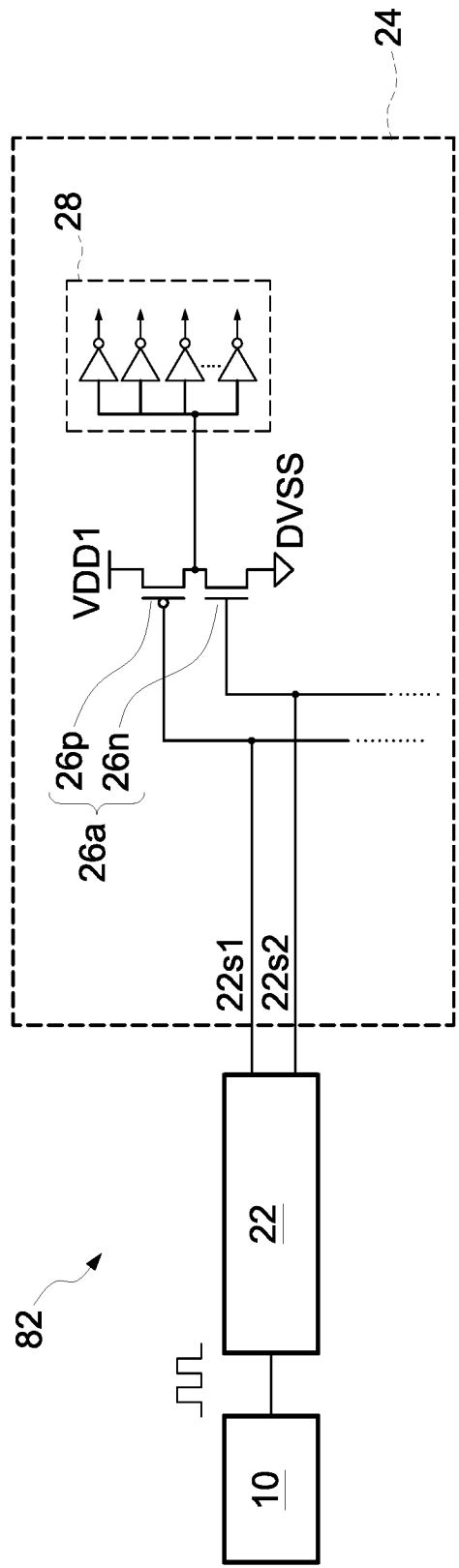
FIG. 4 illustrates a schematic view of a test circuit for a semiconductor wafer, in accordance with some embodiments of the present disclosure.

FIG. 4 illustrates a schematic view of a test circuit for a semiconductor wafer, in accordance with some embodiments of the present disclosure. FIG. 4 shows a test circuit 82. The test circuit 82 can be located within the PCM device 4 as shown in FIG. 1A. The test circuit 82 can be a portion of the PCM device 4 as shown in FIG. 1A.

The test circuit 82 includes an oscillator 10, a clock generator 22, and a capacitance test circuit 24. The clock generator 22 can receive a signal from the oscillator 10 and then generate two clock signals 22s1 and 22s2. The signal provided by the oscillator 10 may have a frequency. The clock signals 22s1 and 22s2 can be generated in accordance with the frequency of the signal provided by the oscillator 10. The clock signals 22s1 and 22s2 can be generated to have a frequency substantially identical to the frequency of the signal provided by the oscillator 10.

The clock generator 22 is configured to eliminate the short current incurred during the operations of the test circuit 24. The clock generator 22 can also be referred to as a non-overlapping block in the subsequent paragraphs of the present disclosure. The characteristics of the clock signals 22s1 and 22s2 will be illustrated in accordance with FIG. 5.

The capacitance test circuit 24 includes a driver 26a and a test device 28. The driver 26a can be referred to as a driving circuit in the subsequent paragraphs of the present disclosure. The driver 26a may adjust the amplitude of the signals provided by the clock generator 22 before the clock generator 22 provides those signals to the test device 28. The driver 26a may adjust the amplitude of the current/voltage provided by the clock generator 22. In some embodiments, the driver 26a can be implemented using transistors 26p and 26n. In some embodiments, the transistor 26p can be a p-type MOSFET, and the transistor 26n can be an n-type MOSFET.

The test device 28 can include a plurality of parallelly connected oscillators. In some embodiments, the test device 28 can include a number N of parallelly connected oscillators. In some embodiments, each of the parallelly connected oscillators of the test device 28 are identical. In some embodiments, each of the parallelly connected oscillators of the test device 28 are identical to the oscillator 10.

Figure 5:
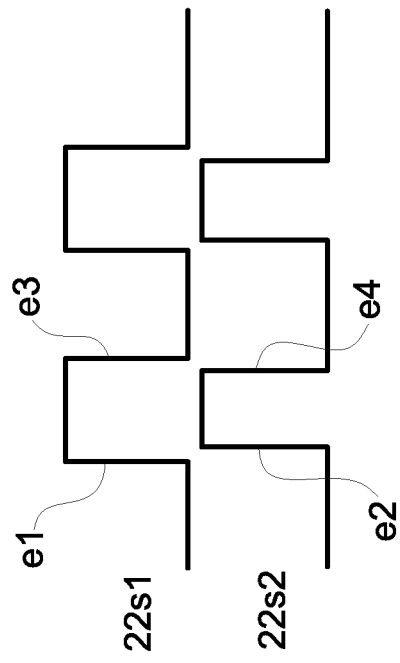
FIG. 5 illustrates a schematic view of the clock signals provided by a clock generator, in accordance with some embodiments of the present disclosure.

FIG. 5 illustrates a schematic view of the clock signals provided by a clock generator, in accordance with some embodiments of the present disclosure.

FIG. 5 shows the clock signals 22s1 and 22s2 generated by the clock generator 22. The clock signal 22s1 can be provided to the gate of the transistor 26p. The clock signal 22s2 can be provided to the gate of the transistor 26n. The clock signal 22s1 can control the on/off switch of the transistor 26p. The clock signal 22s2 can control the on/off switch of the transistor 26n.

Referring to FIG. 5, a rising edge e1 of the clock signal 22s1 is not aligned with a rising edge e2 of the clock signal 22s2. A falling edge e3 of the clock signal 22s1 is not aligned with a falling edge e4 of the clock signal 22s2. The signals 22s1 and 22s2 can be referred to as two "non-overlapping" signals. The clock generator 22 can be referred to as a "non-overlapping" block.

Using the signals 22s1 and 22s2, the transistor 26n will be turned off when the transistor 26p is on. Using the signals 22s1 and 22s2, the transistor 26p will be turned off when the transistor 26n is on. The signals 22s1 and 22s2 can be used to eliminate the short current incurred during the operation of the parallelly connected oscillators of the test device 28 (shown in FIG. 4).

Figure 6:
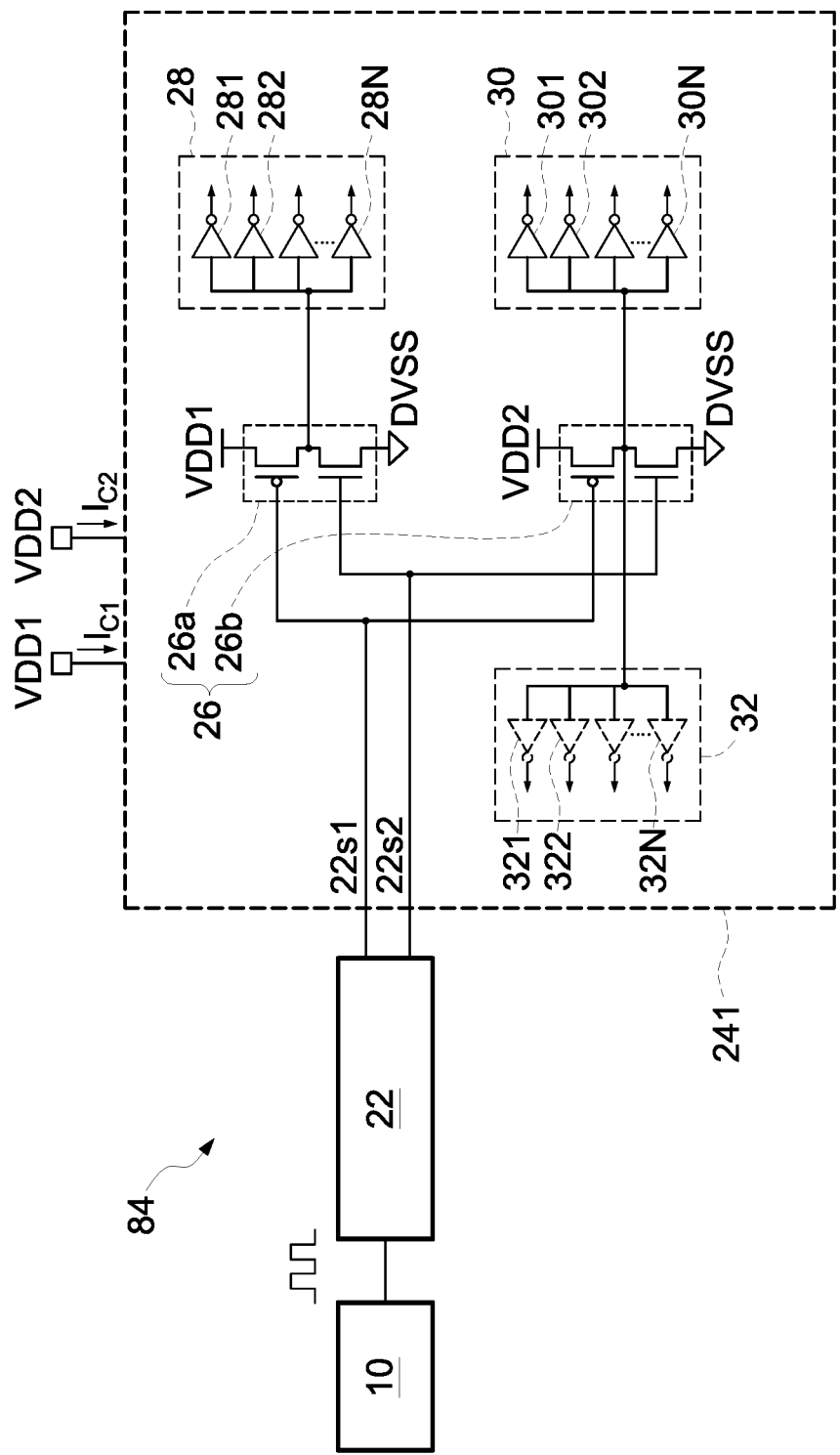
FIG. 6 illustrates a schematic view of a test circuit for a semiconductor wafer, in accordance with some embodiments of the present disclosure.

FIG. 6 illustrates a schematic view of a test circuit for a semiconductor wafer, in accordance with some embodiments of the present disclosure. FIG. 6 shows a test circuit 84. The test circuit 84 can be located within the PCM device 4 as shown in FIG. 1A. The test circuit 84 can be a portion of the PCM device 4 as shown in FIG. 1A.

The test circuit 84 includes an oscillator 10, a clock generator 22, and a capacitance test circuit 241. The clock generator 22 can receive a signal from the oscillator 10 and then generate two clock signals 22s1 and 22s2. The capacitance test circuit 241 includes a pair of drivers 26a and 26b. The capacitance test circuit 241 further includes a test device 28 coupled with the driver 26a. The capacitance test circuit 241 further includes test devices 30 and 32 coupled with the driver 26b.

The test device 28 can refer to a first branch of the test circuit 241. The test devices 30 and 32 can refer to a second branch of the test circuit 241. In some embodiments, the test devices 30 and 32 can be deemed as a single circuit. The functions and characteristics of the oscillator 10 and the clock generator 22 are identical to those discussed above in accordance with FIGS. 2, 3A, 3B, 4 and 5, and thus will not be repeated here.

The test device 28 is electrically coupled with a supply voltage VDD1, and receives a current $I_{C1}$ from the supply voltage VDD1. The test device 28 can include a plurality of parallelly connected oscillators 281, 282, . . . , and 28N. The number "N" is a positive integer. In some embodiments, each of the parallelly connected oscillators 281, 282, . . . , and 28N are identical. In some embodiments, each of the parallelly connected oscillators 281, 282, ..., and 28N are identical to the oscillator 10.

The test devices 30 and 32 are electrically coupled with a supply voltage VDD2, and receive a current $I_{C2}$ from the supply voltage VDD2. The test device 30 can include a plurality of parallelly connected oscillators 301, 302, ..., and 30N. In some embodiments, each of the parallelly connected oscillators 301, 302, ..., and 30N are identical. In some embodiments, each of the parallelly connected oscillators 301, 302, ..., and 30N are identical to the oscillator 10.

The test device 32 can include a plurality of parallelly connected oscillators 321, 322, ..., and 32N. In some embodiments, each of the parallelly connected oscillators 321, 322, ..., and 32N are identical.

The oscillator 321 is identical to the oscillator 10, except that a first portion of the oscillator 321 is disconnected from a second portion of the oscillator 321. In some embodiments, the first portion of the oscillator 321 can be formed during the FEOL of a semiconductor wafer (for example, the semiconductor wafer 1). In some embodiments, the second portion of the oscillator 321 can be formed during the BEOL of a semiconductor wafer. The FEOL portion of the oscillator 321 can be disconnected from the BEOL portion of the oscillator 321.

Similarly, for the oscillator 322 of the test device 32, the FEOL portion of the oscillator 322 is disconnected from the BEOL portion of the oscillator 322. Similarly, for each of the remaining oscillators 323, 324 (not shown), ..., and 32N of the test device 32, their FEOL portion is disconnected from their BEOL portion.

Referring again to FIG. 6, the test device 28 can be used to measure the effective capacitance $C_{FE+BE}$. The effective capacitance $C_{FE+BE}$ is a capacitance that takes into consideration all the parasitic capacitances that exist within the test device 28, including the parasitic capacitances that exist within both the FEOL portion and the BEOL portion of the test device 28. The capacitance $C_{FE+BE}$ can be obtained based on the equation below:

$$C_{FE+BE} = \frac{I_{C1}}{VDD1 \times freq} \quad \text{(equation 3)}$$

The parameter 'freq' in the above equation is the frequency of the signal provided by the oscillator 10.

The test device 30 can be used to measure the effective capacitances including both the FEOL portion and the BEOL portion of the test device 30. The test device 32 can be used to measure the effective capacitances included only in the BEOL portion of the test device 32, because the FEOL portion of the test device 32 is disconnected from the BEOL portion of the test device 32.

The test devices 30 and 32 can be used to measure the effective capacitance $C_{FE+2BE}$. The effective capacitance $C_{FE+2BE}$ is a sum of the capacitances measured by the test devices 30 and 32, respectively. The capacitance $C_{FE+2BE}$ can be obtained according to the equation below:

$$C_{FE+2BE} = \frac{I_{C2}}{VDD2 \times freq} \quad \text{(equation 4)}$$

With the equations 3 and 4, the capacitance of the BEOL portion and the capacitance of the FEOL portion can be individually characterized. For example, the capacitance $C_{BE}$ of the BEOL portion can be obtained according to the equation below:

$$C_{BE} = C_{FE+2BE} - C_{FE+BE} \quad \text{(equation 5)}$$

Furthermore, the capacitance $C_{FE}$ of the FEOL portion can be obtained according to the equation below:

$$C_{FE} = C_{FE+BE} - C_{BE} \quad \text{(equation 6)}$$

The capacitance $C_{BE}$ measured by the test circuit 84 can be indicative of the effective capacitance of the BEOL portion of the entire wafer (for example, the semiconductor wafer 1). The capacitance $C_{FE}$ measured by the test circuit 84 can be indicative of the effective capacitance of the FEOL portion of the entire wafer (for example, the semiconductor wafer 1).

By utilizing the test circuit 84 in combination with the equations 3-6 as stated above, the accuracy regarding the effective capacitance measurement of a semiconductor wafer increases, because the capacitances contributed by the BEOL portion and the FEOL portion of the wafer can be individually identified. Also, the accuracy regarding the evaluation of frequency response of a semiconductor wafer increases.

In addition, by utilizing the clock generator 22, the accuracy regarding the effective capacitance measurement of a semiconductor wafer increases, because short currents incurred during the operations of the test devices 28, 30 and 32 are eliminated.

The methodology described in accordance with FIG. 6 can be referred to as "capacitance partition" in the subsequent paragraphs of the present disclosure. The concept of capacitance partition can be extended to layer-basis capacitance measurements/identifications. The details of layer-basis capacitance measurements/identifications are illustrated in accordance with FIG. 7.

Figure 7:
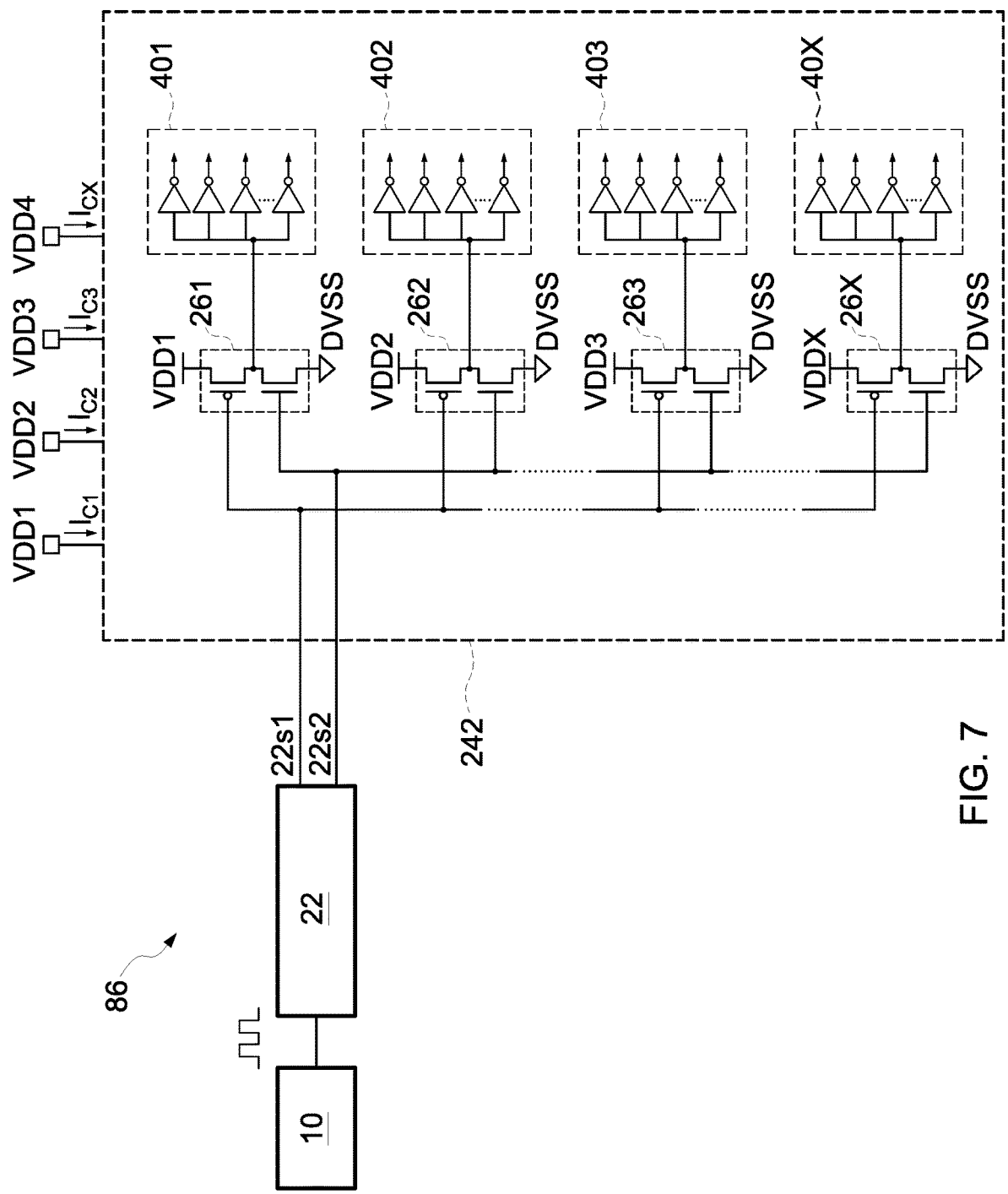
FIG. 7 illustrates a schematic view of a test circuit for a semiconductor wafer, in accordance with some embodiments of the present disclosure.

FIG. 7 illustrates a schematic view of a test circuit for a semiconductor wafer, in accordance with some embodiments of the present disclosure. FIG. 7 shows a test circuit 86. The test circuit 86 can be located within the PCM device 4 as shown in FIG. 1A. The test circuit 86 can be a portion of the PCM device 4 as shown in FIG. 1A.

The test circuit 86 includes an oscillator 10, a clock generator 22, and a capacitance test circuit 242. The clock generator 22 can receive a signal from the oscillator 10 and then generate two clock signals 22s1 and 22s2. The functions and characteristics of the oscillator 10 and the clock generator 22 are identical to those discussed above in accordance with FIGS. 2, 3A, 3B, 4 and 5, and thus will not be repeated here.

The capacitance test circuit 242 includes drivers 261, 261, 263, ..., and 26X. The capacitance test circuit 242 further includes test devices 401, 402, 403, ..., and 40X. The number "X" can be a positive integer greater than 1.

The test device 401 is electrically coupled with the driver 261. The test device 402 is electrically coupled with the driver 262. The test device 403 is electrically coupled with the driver 263. The test device 40X is electrically coupled with the driver 26X.

The test device 401 is electrically coupled with a supply voltage VDD1, and receives a current $I_{C1}$ from the supply voltage VDD1. The test device 402 is electrically coupled with a supply voltage VDD2, and receives a current $I_{C2}$ from the supply voltage VDD2. The test device 403 is electrically coupled with a supply voltage VDD3, and receives a current $I_{C3}$ from the supply voltage VDD3. The test device 40X is electrically coupled with a supply voltage VDDX, and receives a current $I_{CX}$ from the supply voltage VDDX.

The test device 401 can include a plurality of parallelly connected oscillators. The test device 401 can include a number N of identical oscillators. The number "N" is a positive integer. The test device 401 can be utilized to measure the capacitance associated with the FEOL portion and a portion of the BEOL portion of a semiconductor wafer. For example, the test device 401 can be utilized to measure the capacitance associated with the FEOL portion and the first two metal layers of the BEOL portion of a semiconductor wafer.

The first two metal layers of a semiconductor wafer are usually referred to as the "Metal 0" and "Metal 1" in the semiconductor industry. For example, referring back to FIG. 1B, the metal layers 6M0 and 6M1 can be the first two metal layers of a semiconductor wafer. The test device 401 can be utilized to measure the capacitance $C_{FE+BE\ (M0\sim M1)}$.

The test device 401 can be formed by eliminating the connections between the second metal layer (i.e., Metal 1) and all the other metal layers (i.e., Metal 2 to Metal X) above the second metal layer. In some embodiments, the conductive vias between the second metal layer (i.e., Metal 1) and the third metal layer (i.e., Metal 2) can be omitted during the manufacturing of the test device 401.

The test device 402 can include a plurality of parallelly connected oscillators. The test device 402 can include a number N of identical oscillators. The test device 402 can be utilized to measure the capacitance associated with the FEOL portion and a portion of the BEOL portion of a semiconductor wafer. For example, the test device 402 can be utilized to measure the capacitance associated with the FEOL portion and the first three metal layers of the BEOL portion of a semiconductor wafer.

The first three metal layers of a semiconductor wafer are usually referred to as the "Metal 0", "Metal 1" and "Metal 2" in the semiconductor industry. For example, referring back to FIG. 1B, the metal layers 6M0, 6M1 and 6M2 can be the first three metal layers of a semiconductor wafer. The test device 402 can be utilized to measure the capacitance $C_{FE+BE\ (M0\sim M2)}$.

The test device 402 can be formed by eliminating the connections between the third metal layer (i.e., Metal 2) the all the other metal layers (i.e., Metal 3 to Metal X) above the third metal layer. In some embodiments, the conductive vias between the third metal layer (i.e., Metal 2) and the fourth metal layer (i.e., Metal 3) can be omitted during the manufacturing of the test device 402.

The test device 403 can include a plurality of parallelly connected oscillators. The test device 403 can include a number N of identical oscillators. The test device 403 can be utilized to measure the capacitance associated with the FEOL portion and a portion of the BEOL portion of a semiconductor wafer. For example, the test device 403 can be utilized to measure the capacitance associated with the FEOL portion and the first four metal layers of the BEOL portion of a semiconductor wafer.

The first four metal layers of a semiconductor wafer can be referred to as the "Metal 0," "Metal 1," "Metal 2" and "Metal 3." The test device 403 can be utilized to measure the capacitance $C_{FE+BE(M0\sim M3)}$.

The test device 403 can be formed by eliminating the connections between the fourth metal layer (i.e., Metal 3) and all the other metal layers (i.e., Metal 4 to Metal X) above the fourth metal layer. In some embodiments, the conductive vias between the fourth metal layer (i.e., Metal 3) and the fifth metal layer (i.e., Metal 4) can be omitted during the manufacturing of the test device 403.

The test device 40X can include a plurality of parallelly connected oscillators. The test device 40X can include a number N of identical oscillators. The test device 403 can be utilized to measure the capacitance associated with the FEOL portion and a portion of the BEOL portion of a semiconductor wafer. The test device 40X can be utilized to measure the capacitance $C_{FE+BE(M0\sim M2)}$. The number "X" can be any positive integer greater than 1.

Utilizing the capacitances measured by the test devices 401 and 402, the capacitance incurred by the third metal layer (i.e., Metal 2) can be identified. The capacitance incurred by the third metal layer (i.e., Metal 2) can be obtained by subtracting the value of $C_{FE+BE(M0\sim M1)}$ from the value of $C_{FE+BE(M0\sim M2)}$.

Utilizing the capacitances measured by the test devices 402 and 403, the capacitance incurred by the fourth metal layer (i.e., Metal 3) can be identified. The capacitance incurred by the fourth metal layer (i.e., Metal 3) can be obtained by subtracting the value of $C_{FE+BE(M0\sim M2)}$ from the value of $C_{FE+BE(M0\sim M3)}$.

In some embodiments, the test devices 401, 402, 403, . . . and 40X can be modified to obtain the capacitance incurred by any specific metal layer of a semiconductor wafer. For example, the test device 401 can be modified to measure the capacitance $C_{FE}$ associated with the FEOL portion of the BEOL portion of a semiconductor wafer, and the test device 402 can be modified to measure the capacitance $C_{FE+BE(M0)}$ associated with the FEOL portion and the first metal layer (i.e., Metal 0) of the BEOL portion of the semiconductor wafer. The capacitance incurred by the first metal layer (i.e., Metal 0) can be obtained by subtracting the value of $C_{FE}$ from the value of $C_{FE+BE(M0)}$.

Figure 8:
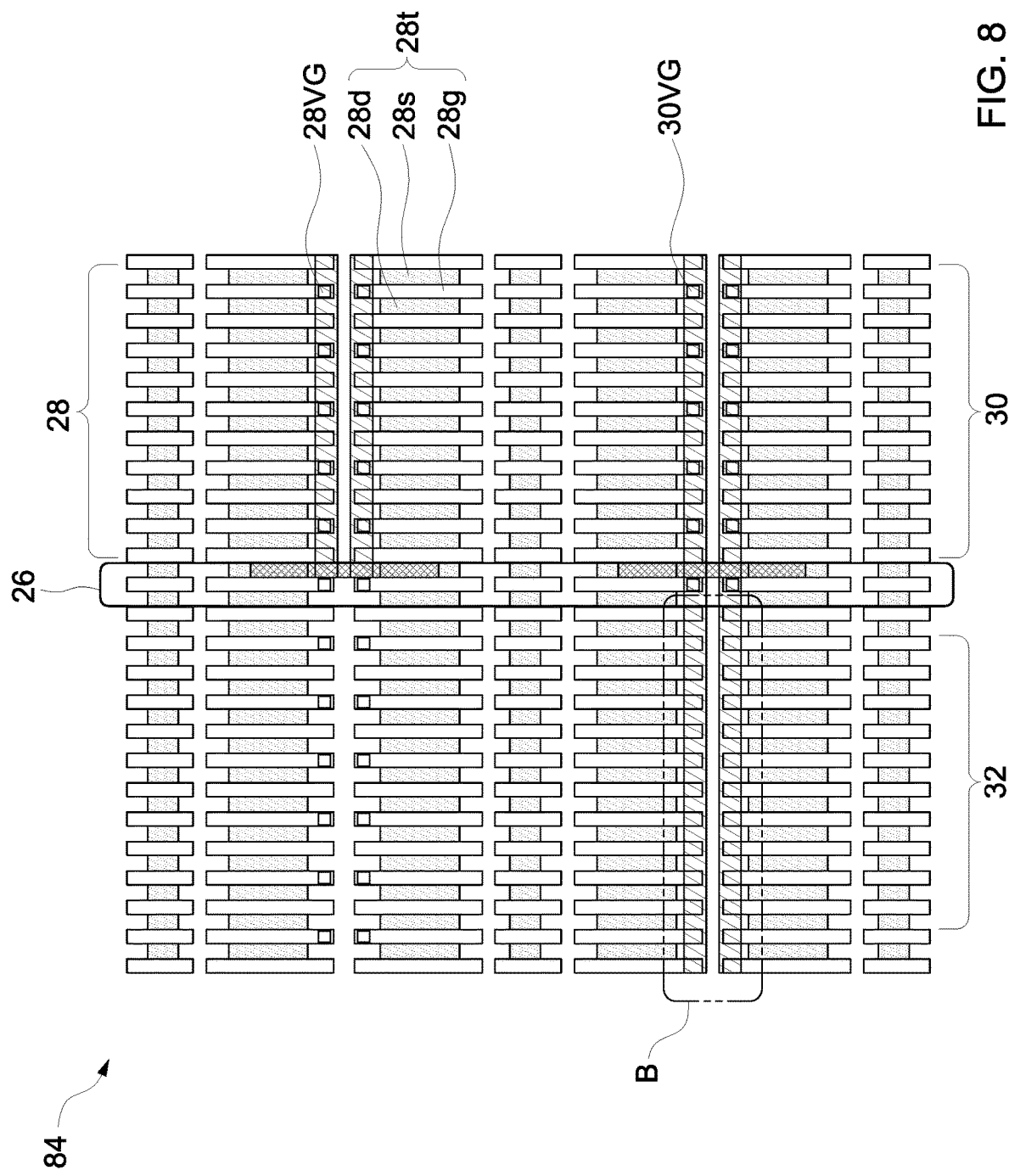
FIG. 8 illustrates a schematic view of the layout of a test circuit for a semiconductor wafer, in accordance with some embodiments of the present disclosure.

FIG. 8 illustrates a schematic view of the layout of a test circuit for a semiconductor wafer, in accordance with some embodiments of the present disclosure. The layout shown in FIG. 8 corresponds to the test circuit 84 as shown in FIG. 6.

The test device 28 can be located at the top right corner of the layout. The test device 30 can be located at the bottom right corner of the layout. The test device 32 is located at the bottom left corner of the layout. The drivers 26a and 26b (collectively labeled as 26) can be located near the center of the layout.

Referring to FIG. 8, the test device 28 includes a plurality of transistors, and each of the transistors include a source region, a drain region and a gate region. For example, the transistor 28t includes a source region 28s, a drain region 28d and a gate region 28g. The test device 28 can be allocated on the wafer as a transistor array including regularly-arranged transistors. Similarly, the test devices 30 and 32 can be allocated on the wafer as transistor arrays including regularly-arranged transistors.

For the test device 28, the BEOL portion can be connected to the FEOL portion through several conductive vias. For example, the BEOL portion and the FEOL portion of the test device 28 can be connected through a plurality of gate vias 28VG.

For the test device 30, the BEOL portion can be connected to the FEOL portion through several conductive vias. For example, the BEOL portion and the FEOL portion of the test device 30 can be connected through a plurality of gate vias 30VG.

For the test device 32, the BEOL portion can be disconnected from the FEOL portion. Referring to the dotted rectangle B shown in FIG. 8, there is no gate via disposed on the gate regions of the transistors of the test device 32.

The test devices 28, 30 and 32 can have similar arrangements of transistors. The test devices 28, 30 and 32 can have an identical arrangement of transistors. In some embodiments, the test devices 28, 30 and 32 are arranged closed to each other on the semiconductor wafer so as to reduce undesired variations. The test device 30 and the test device 32 can be arranged in the same rows on the semiconductor wafer. That is, the test device 30 is located adjacent to the test device 32 at the bottom of the layout.

In some embodiments, the transistors of the test devices 28, 30 and 32 can be manufactured with a scale greater than that of the transistors of the product on the wafer (for example, the semiconductor device 2 shown in FIG. 1A). In some embodiments, the transistors of the test devices 28, 30 and 32 can be manufactured with a dimension greater than 10 μm×10 μm to avoid undesired layout dependent effects (LDEs).

Figure 9:
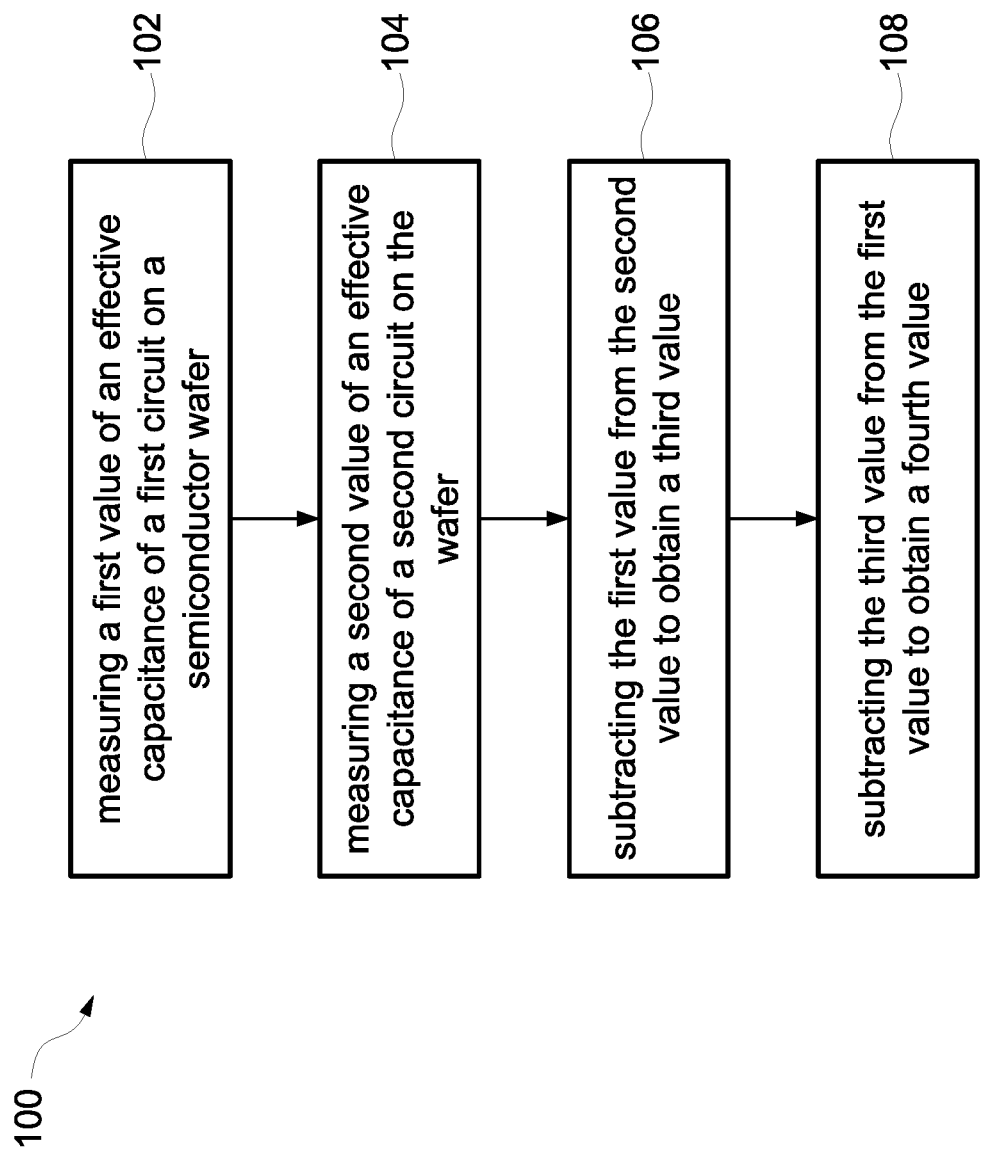
FIG. 9 illustrates a flow chart including operations for measuring characteristics of a wafer, in accordance with some embodiments of the present disclosure.

FIG. 9 illustrates a flow chart including operations for measuring characteristics of a wafer, in accordance with some embodiments of the present disclosure. FIG. 9 shows a flow chart 100. The flow chart 100 includes operations 102, 104, 106 and 108. Although the operations 102, 104, 106 and 108 of FIG. 9 are depicted in sequence, it can be contemplated that the operations 102, 104, 106 and 108 can be performed in an order different from that shown in FIG. 9.

In the operation 102, a first value of an effective capacitance of a first circuit on a semiconductor wafer is measured. The operation 102 can be performed, for example, by the test circuit 84 shown in FIG. 6 or the test circuit 86 shown in FIG. 7. For example, an effective capacitance of the test circuit 28 can be measured by utilizing the equation 3 as described in the previous paragraphs.

In the operation 104, a second value of an effective capacitance of a second circuit on the wafer is measured. The operation 104 can be performed, for example, by the test circuit 84 shown in FIG. 6 or the test circuit 86 shown in FIG. 7. For example, an effective capacitance of the test circuits 30 and 32 can be measured by utilizing the equation 4 as described in the previous paragraphs.

In the operation 106, the first value is subtracted from the second value to obtain a third value. The operation 106 can be performed, for example, by utilizing the equation 5 as described in the previous paragraphs. In the operation 108, the third value is subtracted from the first value to obtain a fourth value. The operation 108 can be performed, for example, by utilizing the equation 6 as described in the previous paragraphs.

The methodologies disclosed in the present disclosure, including elimination of the short current, capacitance partition, and layer-basis capacitance measurements/identifications can be widely applied to the field of debugging or the built-in calibration mode for devices involving capacitive circuits.

In some embodiments, the methodologies disclosed in the present disclosure can be applied to the calibration of charge-based capacitive digital-to analog converter (DAC). For example, the methodologies disclosed in the present disclosure can be used for the foreground/background calibration of unit capacitance characterization with BEOL capacitance included. Furthermore, the methodologies disclosed in the present disclosure can be used for the self-test pertaining to the start-up onetime unit capacitance.

In some embodiments, the methodologies disclosed in the present disclosure can be applied to the built-in self-test (BIST) circuit for delay cell based digital control oscillator (DCO), to measure gate driven intrinsic capacitance. In addition, the methodologies disclosed in the present disclosure can be applied to any other devices including complementary metal-oxide-semiconductor (CMOS) circuitry for debug mode capacitance measurements.

Some embodiments of the present disclosure provide a device for measuring characteristics of a wafer. The device comprises a first circuit on the wafer and having a first number of parallelly connected oscillators, and a second circuit on the wafer and having the first number of parallelly connected oscillators; wherein a first portion of the second circuit is disconnected from a second portion of the second circuit.

Some embodiments of the present disclosure provide a device for measuring a frequency response of a wafer. The device comprises a first oscillator configured to provide a first signal having a first frequency; a clock generator configured to receive the first signal and generate a first clock signal and a second clock signal having the first frequency; and a first circuit on the wafer and having a first number of parallelly connected oscillators; wherein a first portion of the first circuit is disconnected from a second portion of the first circuit.

Some embodiments of the present disclosure provide a method for measuring characteristics of a wafer. The method comprises: measuring a first value of an effective capacitance of a first circuit on the wafer; and measuring a second value of an effective capacitance of a second circuit on the wafer; wherein a first portion of the second circuit is disconnected from a second portion of the second circuit.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device for measuring characteristics of a wafer, comprising:
   a first circuit on the wafer and having a first number of parallelly connected first ring oscillators;
   a second circuit on the wafer and having the first number of parallelly connected second ring oscillators; and
   a first driver coupled to the first circuit and the second circuit, and configured to drive the first circuit and the second circuit, wherein
   the first driver receives a first clock signal and a second clock signal that are generated from a third clock signal;
   the first clock signal, the second clock signal, and the third clock signal have a first frequency;
   a first duty cycle of the first clock signal is larger than a second duty cycle of the second clock signal; and
   each second ring oscillator of the second circuit includes a first portion formed during a front-end-of-line of the wafer and a second portion formed during a back-end-of-line of the wafer, and the first portion of each second ring oscillator of the second circuit formed during the front-end-of-line of the wafer is electrically disconnected from the second portion of each second ring oscillator of the second circuit formed during the back-end-of-line of the wafer.

2. The device of claim 1, further comprising a third circuit on the wafer and having the first number of parallelly connected third ring oscillators.

3. The device of claim 2, further comprising a second driver coupled with the third circuit, wherein the second driver is configured to receive the first clock signal and the second clock signal.

4. The device of claim 1, wherein a rising edge of the first clock signal is not aligned with a rising edge of the second clock signal.

5. The device of claim 4, wherein a falling edge of the first clock signal is not aligned with a falling edge of the second clock signal.

6. The device of claim 1, wherein a first portion of the first circuit is electrically disconnected from a second portion of the first circuit.

7. The device of claim 6, wherein the first portion of the first circuit is formed before a first metal layer of the wafer, and the second portion of the first circuit is formed after the first metal layer of the wafer.

8. The device of claim 7, wherein the first portion of the second circuit is formed before a second metal layer of the wafer, and the second portion of the second circuit is formed after the second metal layer of the wafer.

9. A device for measuring characteristics of a wafer, comprising:
a first circuit on the wafer and having a first number of parallelly connected first ring oscillators; and
a second circuit on the wafer and having the first number of parallelly connected second ring oscillators;
a first driver, coupled to the first circuit, and configured to drive the first circuit using a first clock signal and a second clock signal that are generated from a third clock signal;
a second driver, coupled to the second circuit, and configured to drive the second circuit using the first clock signal and the second clock signal; wherein
the first clock signal, the second clock signal, and the third clock signal have a first frequency;
a first duty cycle of the first clock signal is larger than a second duty cycle of the second clock signal;
each first ring oscillator of the first circuit includes a first portion formed during a front-end-of-line of the wafer and a second portion formed during a back-end-of-line of the wafer,
each second ring oscillator of the second circuit includes a first portion formed during the front-end-of-line of the wafer and a second portion formed during the back-end-of-line of the wafer,
the first portion of each first ring oscillator of the first circuit formed during the front-end-of-line of the wafer is electrically disconnected from the second portion of each first ring oscillator of the first circuit formed during the back-end-of-line of the wafer, and
the first portion of each second ring oscillator of the second circuit formed during the front-end-of-line of the wafer is electrically disconnected from the second portion of each second ring oscillator of the second circuit formed during the back-end-of-line of the wafer.

10. The device of claim 9,
wherein a rising edge of the first clock signal is not aligned with a rising edge of the second clock signal, and a falling edge of the first clock signal is not aligned with a falling edge of the second clock signal.

11. The device of claim 9, wherein the first portion of the first circuit is formed before a first metal layer of the wafer, and the second portion of the first circuit is formed after the first metal layer of the wafer.

12. The device of claim 11, wherein:
the first portion of the second circuit is formed before a second metal layer of the wafer;
the second portion of the second circuit is formed after the second metal layer of the wafer; and
the first metal layer is closer to the wafer than the second metal layer.

13. The device of claim 9, further comprising:
a third oscillator configured to provide the third clock signal; and
a clock generator configured to generate the first clock signal and the second clock signal based on the third clock signal.

14. A device for measuring characteristics of a wafer, comprising:
a first circuit on the wafer and having a first number of parallelly connected ring oscillators;
a second circuit on the wafer and having the first number of parallelly connected ring oscillators;
a first driver, coupled to the first circuit, and configured to drive the first circuit using a first clock signal and a second clock signal;
a second driver, coupled to the second circuit, and configured to drive the second circuit using the first clock signal and the second clock signal; and
a clock generator configured to generate the first clock signal and the second clock signal using a third clock signal and provide the first clock signal and the second clock signal to the first driver and the second driver, wherein
the first clock signal, the second clock signal, and the third clock signal have a first frequency;
a first duty cycle of the first clock signal is larger than a second duty cycle of the second clock signal; and
a rising edge of the first clock signal is not aligned with a rising edge of the second clock signal, a falling edge of the first clock signal is not aligned with a falling edge of the second clock signal, each ring oscillator of the second circuit includes a first portion formed during a front-end-of-line of the wafer and a second portion formed during a back-end-of-line of the wafer, and the first portion of each ring oscillator of the second circuit formed during the front-end-of-line of the wafer is electrically disconnected from the second portion of each oscillator of the second circuit formed during the back-end-of-line of the wafer.

15. The device of claim 14, wherein a first portion of the first circuit is formed before a first metal layer of the wafer, and a second portion of the first circuit is formed after the first metal layer of the wafer.

16. The device of claim 15, wherein:
the first portion of the second circuit is formed before a second metal layer of the wafer;
the second portion of the second circuit is formed after the second metal layer of the wafer; and
the first metal layer is closer to the wafer than the second metal layer.

17. The device of claim 1, wherein the first driver is further configured to receive a supply voltage.

18. The device of claim 10, wherein the first driver is further configured to receive a supply voltage.

19. The device of claim 17, wherein the first driver comprises:

a first transistor, having a gate terminal configured to receive the first clock signal, a drain terminal coupled to an output terminal of the first driver, and a source terminal configured to receive the supply voltage; and
a second transistor, having a gate terminal configured to receive the second clock signal, a drain terminal coupled to the output terminal of the first driver, and a source terminal configured to receive a ground voltage.

20. The device of claim 18, wherein:
the first driver comprises:
   a first transistor, having a gate terminal configured to receive the first clock signal, a drain terminal coupled to an output terminal of the first driver, and a source terminal configured to receive the supply voltage; and
   a second transistor, having a gate terminal configured to receive the second clock signal, a drain terminal coupled to the output terminal of the first driver, and a source terminal configured to receive a ground voltage; and
the second driver comprises:
   a third transistor, having a gate terminal configured to receive the first clock signal, a drain terminal coupled to an output terminal of the second driver, and a source terminal configured to receive the supply voltage; and
   a fourth transistor, having a gate terminal configured to receive the second clock signal, a drain terminal coupled to the output terminal of the second driver, and a source terminal configured to receive the ground voltage.

\* \* \* \* \*